US007893530B2

(12) United States Patent
Hsieh

(10) Patent No.: US 7,893,530 B2
(45) Date of Patent: Feb. 22, 2011

(54) CIRCUIT SUBSTRATE AND THE SEMICONDUCTOR PACKAGE HAVING THE SAME

(75) Inventor: Po-Hsin Hsieh, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 407 days.

(21) Appl. No.: 12/014,212

(22) Filed: Jan. 15, 2008

(65) Prior Publication Data
US 2008/0169573 A1 Jul. 17, 2008

(30) Foreign Application Priority Data
Jan. 16, 2007 (TW) .............................. 96101647 A

(51) Int. Cl.
*H01L 23/34* (2006.01)
(52) U.S. Cl. ................. 257/723; 257/E23.07; 257/724; 257/778; 438/107; 438/109
(58) Field of Classification Search ................. 361/784; 257/E23.023, 679, 723–725, 778, E23.07; 235/379, 380, 441, 492; 705/41, 43, 65, 705/66, 75; 438/107, 109, 110
See application file for complete search history.

(56) References Cited

U.S. PATENT DOCUMENTS

| | | | | |
|---|---|---|---|---|
| 4,467,400 A * | 8/1984 | Stopper | ........................ | 361/767 |
| 5,040,052 A * | 8/1991 | McDavid | .................... | 361/793 |
| 5,815,427 A * | 9/1998 | Cloud et al. | .................... | 365/51 |
| 6,232,990 B1 * | 5/2001 | Poirion | ........................ | 345/519 |
| 6,249,481 B1 * | 6/2001 | Toda et al. | ................ | 365/233.1 |
| 6,313,493 B1 * | 11/2001 | Mori et al. | .................... | 257/296 |
| 6,351,681 B1 * | 2/2002 | Chih et al. | .................... | 700/121 |
| 6,431,456 B2 * | 8/2002 | Nishizawa et al. | .......... | 235/492 |
| 6,727,533 B2 * | 4/2004 | Matsuzaki et al. | .......... | 257/266 |
| 6,787,901 B2 * | 9/2004 | Reyes et al. | .................. | 257/724 |
| 6,909,649 B2 * | 6/2005 | Honjou et al. | .............. | 365/201 |
| 7,075,175 B2 * | 7/2006 | Kazi et al. | .................... | 257/678 |
| 7,089,032 B2 * | 8/2006 | Hongo et al. | ............. | 455/550.1 |
| 7,091,598 B2 * | 8/2006 | Fujita et al. | .................. | 257/691 |
| 7,453,704 B2 * | 11/2008 | Tanaka et al. | ................ | 361/760 |
| 7,728,444 B2 * | 6/2010 | Hayashi | ....................... | 257/786 |
| 2003/0231473 A1 * | 12/2003 | Otaki et al. | .................. | 361/777 |
| 2004/0089955 A1 * | 5/2004 | Zhou | ........................... | 257/787 |
| 2005/0252978 A1 * | 11/2005 | Nishizawa et al. | .......... | 235/492 |

FOREIGN PATENT DOCUMENTS

TW          I261786          9/2006

* cited by examiner

*Primary Examiner*—Chris Chu
(74) *Attorney, Agent, or Firm*—Volentine & Whitt, P.L.L.C.

(57) ABSTRACT

The present invention relates to a circuit substrate comprising an upper surface, a first layout area, a second layout area, and a third layout area. The first layout area is on the upper surface, and has a plurality of first electrical contacts. The second layout area is on the upper surface, and has a plurality of second electrical contacts. The third layout area is on the upper surface, and has a plurality of third electrical contacts. The second and the third electrical contacts that have the same electrical property are electrically connected to each other. Thus, the circuit substrate can be applied to memory chips with different size.

20 Claims, 6 Drawing Sheets

CIRCUIT SUBSTRATE AND THE SEMICONDUCTOR PACKAGE HAVING THE SAME

BACKGROUND OF THE INVENTION

1. Field of the Invention

The present invention relates to a circuit substrate and a semiconductor package having the same, and more particularly to a common circuit substrate and a semiconductor package having the same.

2. Description of the Related Art

FIG. 1 shows a schematic top view of a first conventional circuit substrate applied to a memory card. The circuit substrate 1 includes an upper surface 11, a lower surface (not shown), a first layout area 12, and a second layout area 15. The first layout area 12 is located on the upper surface 11, and has a plurality of first electrical contacts 121 for carrying a memory chip 13 (for example, a flash IC). The first electrical contacts 121 surround the memory chip 13. The memory chip 13 is adhered to the first layout area 12, and has a plurality of first bonding pads 131. The first bonding pads 131 are electrically connected to the first electrical contacts 121 through a plurality of first wires 14.

The second layout area 15 is located on the upper surface 11 and below the first layout area 12, and has a plurality of second electrical contacts 151 for carrying a control chip 16. The second electrical contacts 151 are electrically connected to the first electrical contacts 121 through a first circuit (not shown). The control chip 16 is adhered to the second layout area 15, and has a plurality of second bonding pads 161. The second bonding pads 161 are electrically connected to the second electrical contacts 151 through a plurality of second wires 17.

A plurality of I/O pads (not shown) is disposed on an edge of the lower surface of the circuit substrate 1 for inputting/outputting an external signal. The I/O pads are electrically connected to the second electrical contacts 151 through a second circuit (not shown).

The circuit substrate 1 operates as follows. First, the second electrical contacts 151 and the second bonding pads 161 both can be divided into a first portion and a second portion. An external signal is input into the I/O pads and transmitted to the first portion of the second electrical contacts 151 through the second circuit. Then, the signal is transmitted to the first portion of the second bonding pads 161 of the control chip 16 through the second wires 17, so as to enter the control chip 16 and to be processed therein.

Afterward, the processed signal is output from the second portion of the second bonding pads 161 of the control chip 16, and then transmitted to the second portion of the second electrical contacts 151 through the second wires 17. Next, the signal is further transmitted to the first electrical contacts 121 of the first layout area 12 through the first circuit, and then to the first bonding pads 131 of the memory chip 13 through the first wires 14. Finally, the signal is stored in the memory chip 13.

When a signal is to be withdrawn from the memory chip 13, the signal is first transmitted from the first bonding pads 131 on the memory chip 13 to the first electrical contacts 121 through the first wires 14, and then transmitted to the second portion of the second electrical contacts 151 through the first circuit. Then, the signal is transmitted to the second portion of the second bonding pads 161 of the control chip 16 through the second wires 17, so as to enter the control chip 16 and to be processed therein.

Afterward, the processed signal is output from the first portion of the second bonding pads 161 of the control chip 16, and then transmitted to the first portion of the second electrical contacts 151 through the second wires 17. Next, the signal is further transmitted to the I/O pads through the second circuit, so as to be output externally.

FIG. 2 shows a schematic top view of a second conventional circuit substrate applied to a memory card. The circuit substrate 2 includes an upper surface 21, a lower surface (not shown), a first layout area 22, and a second layout area 25. The first layout area 22 is located on the upper surface 21, and has a plurality of first electrical contacts 221 for carrying a memory chip 23 (for example, a flash IC). The memory chip 23 has a plurality of first bonding pads 231, and the first bonding pads 231 are electrically connected to the first electrical contacts 221 through a plurality of first wires 24.

The second layout area 25 is located on the upper surface 21 and on the right side of the first layout area 22, and has a plurality of second electrical contacts 251 for carrying a control chip 26. The second electrical contacts 251 are electrically connected to the first electrical contacts 221 through a first circuit. The control chip 26 has a plurality of second bonding pads 261, and the second bonding pads 261 are electrically connected to the second electrical contacts 251 through a plurality of second wires 27.

A comparison of FIG. 1 and FIG. 2 shows that the size of the memory chip 13 differs from that of the memory chip 23, so the substrate layout is apparently different from each other and cannot be shared. In practice, there are many types of memory chips and control chips having different profiles that can be applied to the layout of the substrate of a conventional Micro SD Card (Micro Secure Digital (Memory) Card). Thus, when different devices are used together, since the space on the substrate is limited, the arrangement of the chips and the electrical contacts should vary accordingly. As a result, different substrate layout designs have to be adopted to meet different requirements (as shown in FIGS. 1 and 2). When preparing the substrate, there also have to be different types of substrate to meet the requirements of the production, which not only prolongs the manufacturing process, but also increases the design and manufacturing cost of the circuit substrate.

Therefore, it is necessary to provide an innovative and advanced circuit substrate to solve the above problems.

SUMMARY OF THE INVENTION

The present invention is mainly directed to a circuit substrate, which includes an upper surface, a first layout area, a second layout area, and a third layout area. The first layout area is on the upper surface, and has a plurality of first electrical contacts. The second layout area is on the upper surface, and has a plurality of second electrical contacts. The third layout area is on the upper surface, and has a plurality of third electrical contacts. The second and the third electrical contacts that have the same electrical property are electrically connected to each other.

DETAILED DESCRIPTION OF THE INVENTION

Figure 1:
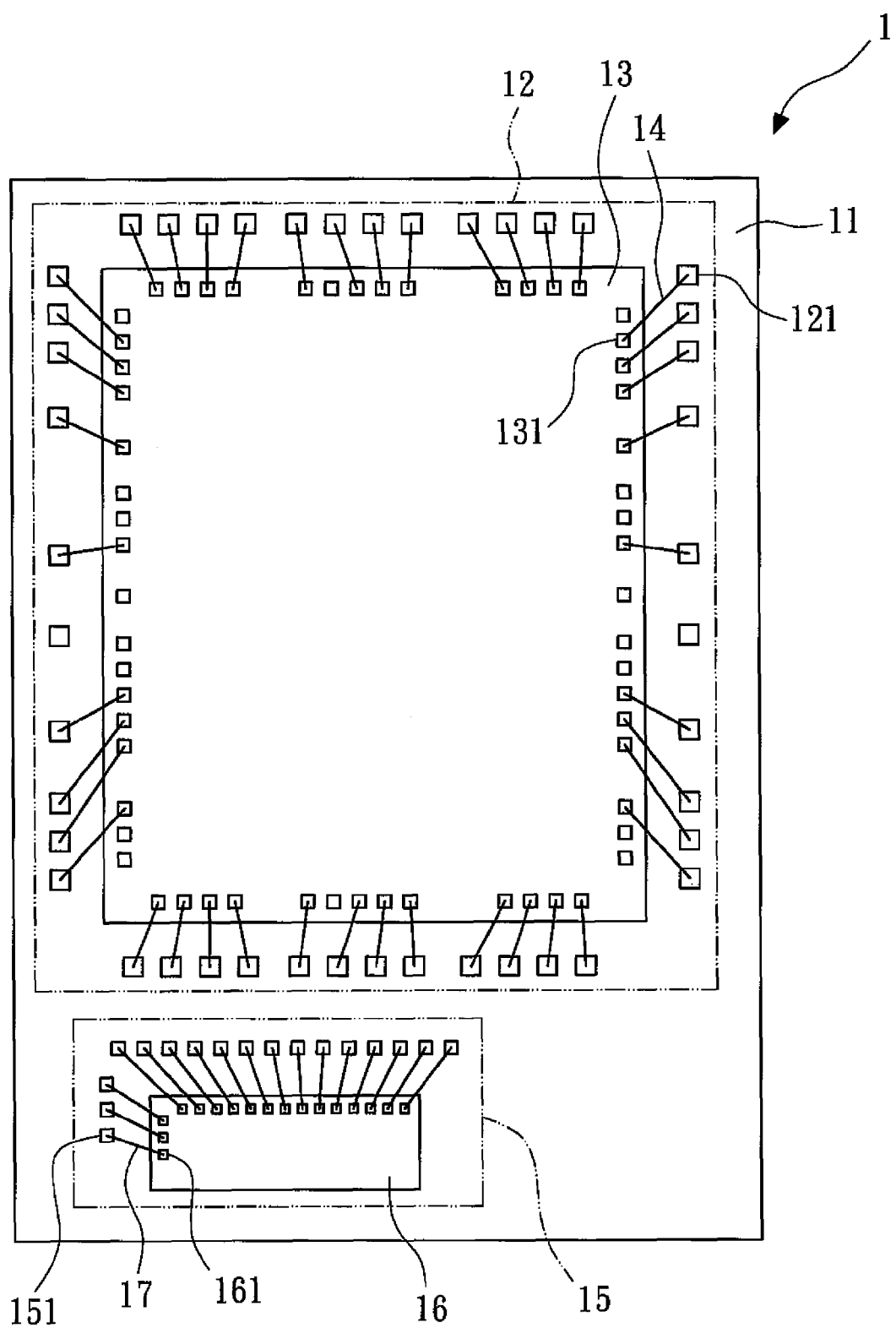
FIG. 1 is a schematic top view of a first conventional circuit substrate applied to a memory card.
Figure 2:
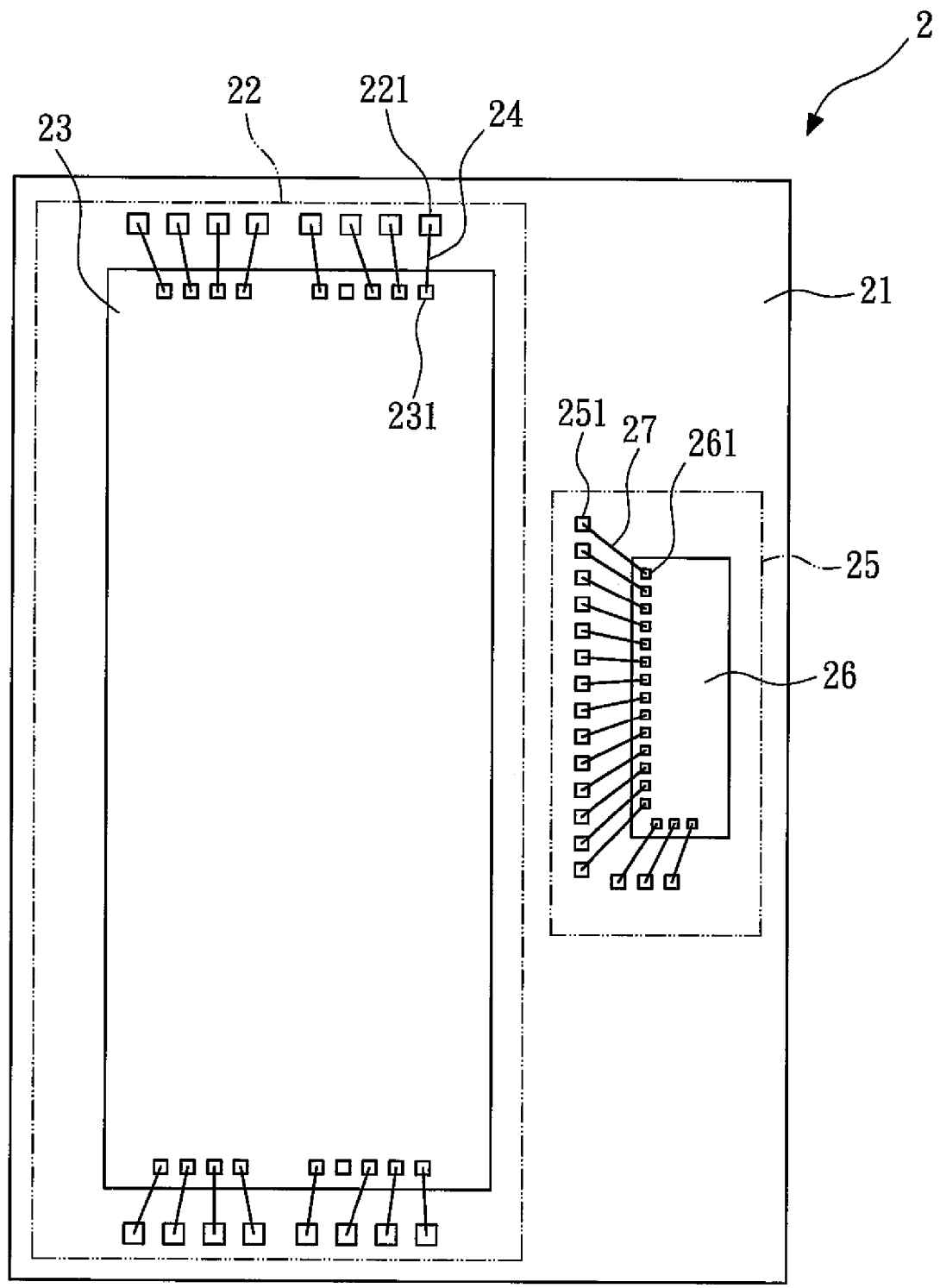
FIG. 2 is a schematic top view of a second conventional circuit substrate applied to a memory card.
Figure 3:
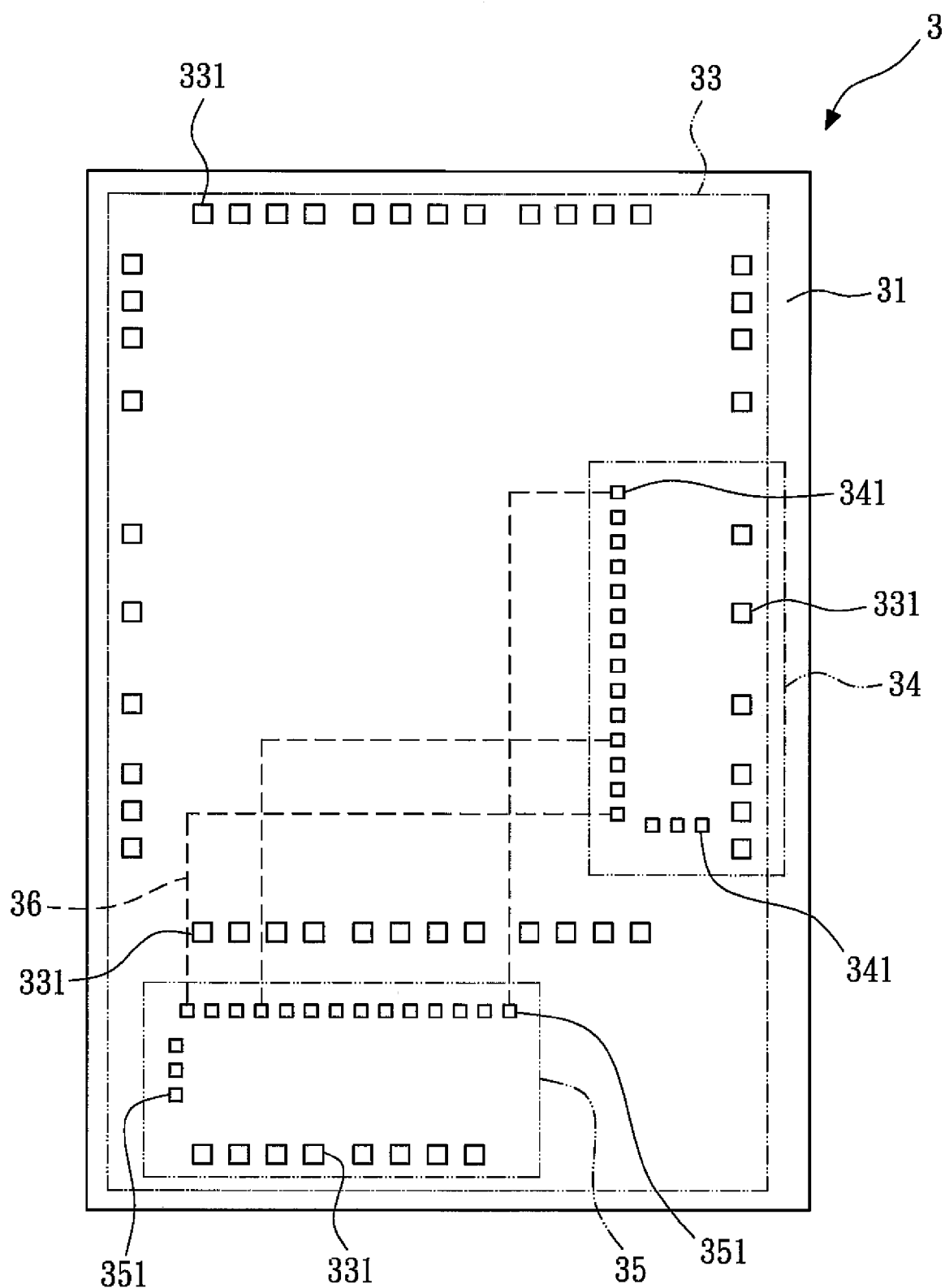
FIG. 3 is a schematic top view of a circuit substrate according to the present invention.

FIG. 3 shows a schematic top view of a circuit substrate according to the present invention. The circuit substrate 3 includes an upper surface 31, a lower surface 32, a first layout area 33, a second layout area 34, and a third layout area 35. The first layout area 33 is located on the upper surface 31, and has a plurality of first electrical contacts 331 for carrying a memory chip (for example, a flash IC) (not shown).

The second layout area 34 is located on the upper surface 31 and on the right side of the first layout area 33. Some portion of the second layout area 34 overlaps the first layout area 33. Alternatively, the second layout area 34 is located in the first layout area 33. The second layout area 34 has a plurality of second electrical contacts 341 for carrying a control chip (not shown).

The third layout area 35 is located on the upper surface 31 and below the first layout area 33. Some portion of the third layout area 35 overlaps the first layout area 33. Alternatively, the third layout area 35 is located in the first layout area 33. The third layout area 35 has a plurality of third electrical contacts 351 for carrying a control chip (not shown).

The second electrical contacts 341 and the third electrical contacts 351 that have the same electrical property are electrically connected to each other through a first circuit 36. The first circuit 36 is located on the upper surface 31 or the lower surface 32 of the circuit substrate 3 or inside the circuit substrate 3. Preferably, the second layout area 34 and the third layout area 35 have a mirror-image corresponding relation. Moreover, the first electrical contacts 331 are electrically connected to the third electrical contacts 351 or the second electrical contacts 341 through a second circuit (not shown).

Figure 4:
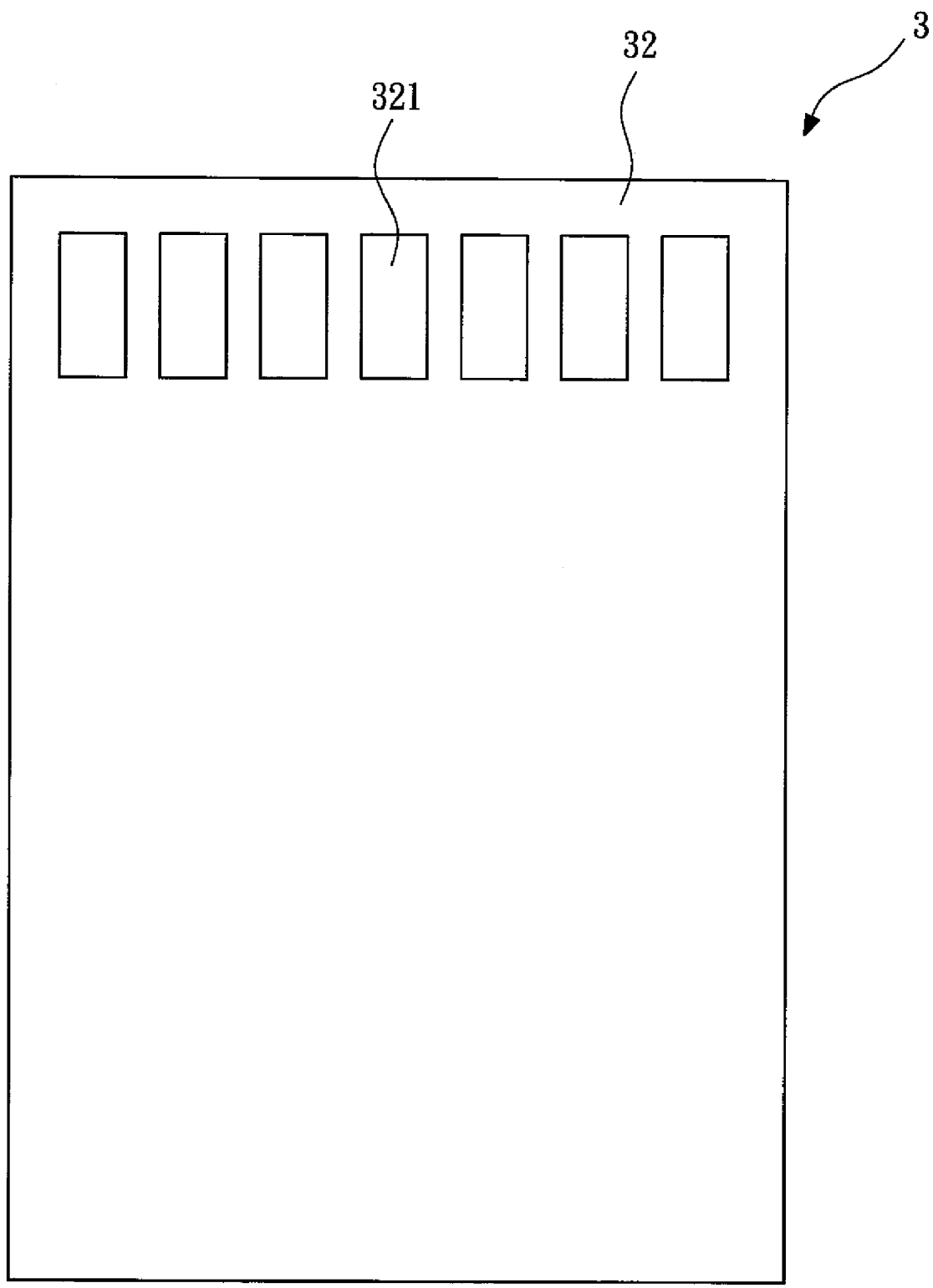
FIG. 4 is a schematic bottom view of a circuit substrate according to the present invention.

FIG. 4 shows a schematic bottom view of a circuit substrate according to the present invention. A plurality of I/O pads 321 is disposed on an edge of the lower surface 32 of the circuit substrate 3 for inputting/outputting an external signal. The I/O pads 321 are electrically connected to the third electrical contacts 351 or the second electrical contacts 341 through a third circuit (not shown).

Figure 5:
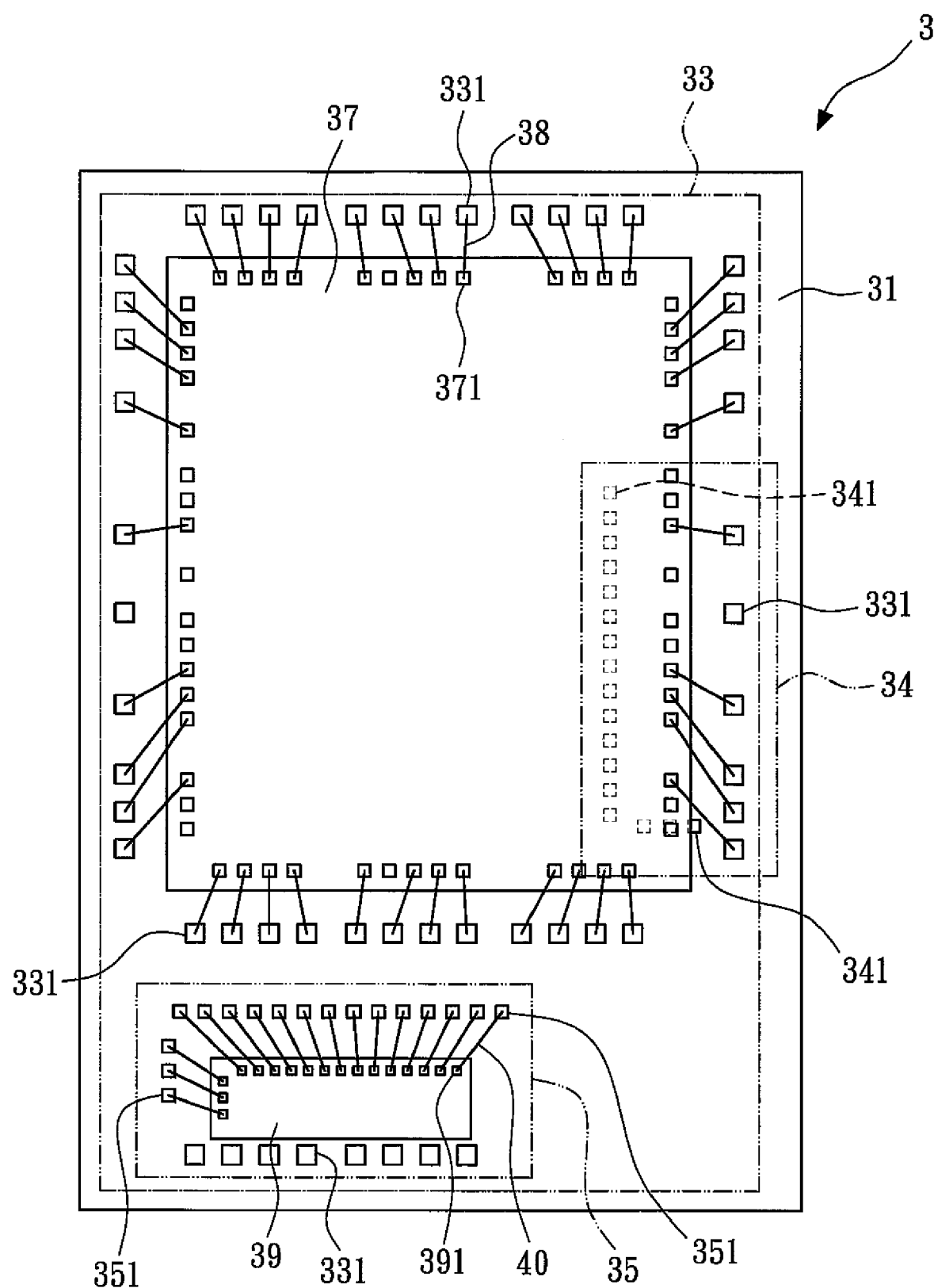
FIG. 5 is a schematic view of a circuit substrate according to a first implementation aspect of the present invention.

FIG. 5 shows a schematic view of a circuit substrate according to a first implementation aspect of the present invention. In this implementation aspect, a memory chip 37 (for example, a flash IC) is adhered to the first layout area 33, and the first electrical contacts 331 surround the memory chip 37. It is understood that the memory chip 37 can also be attached to the first layout area 33 through flip-chip bonding. The memory chip 37 has a plurality of first bonding pads 371, and the first bonding pads 371 are electrically connected to the first electrical contacts 331 through a plurality of first wires 38. As shown in the figure, the memory chip 37 covers a portion of the second layout area 34.

In addition, the control chip 39 is adhered to the third layout area 35, and has a plurality of second bonding pads 391. The second bonding pads 391 are electrically connected to the third electrical contacts 351 through a plurality of second wires 40.

Preferably, a molding compound (not shown) is used to encapsulate the upper surface 31 of the circuit substrate 3, i.e., to encapsulate the memory chip 37, the control chip 39, the first wires 38, and the second wires 40, so as to form a semiconductor package.

In this implementation aspect, the circuit substrate 3 operates as follows. First, the third electrical contacts 351 and the second bonding pads 391 both can be divided into a first portion and a second portion. An external signal is input into the I/O pads 321 (as shown in FIG. 4) and transmitted to the first portion of the third electrical contacts 351 through the third circuit. Then, the signal is transmitted to the first portion of the second bonding pads 391 of the control chip 39 through the second wires 40, so as to enter the control chip 39 and to be processed therein.

Afterward, the processed signal is output from the second portion of the second bonding pad 391 of the control chip 39, and then transmitted to the second portion of the third electrical contacts 351 through the second wires 40. Next, the signal is further transmitted to the first electrical contacts 331 of the first layout area 33 through the second circuit, and then to the first bonding pads 371 of the memory chip 37 through the first wires 38. Finally, the signal is stored in the memory chip 37.

When a signal is to be withdrawn from the memory chip 37, the signal is first transmitted from the first bonding pads 371 on the memory chip 37 to the first electrical contacts 331 through the first wires 38, and then transmitted to the second portion of the third electrical contacts 351 through the second circuit. Then, the signal is transmitted to the second portion of the second bonding pads 391 of the control chip 39 through the second wires 40, so as to enter the control chip 39 and to be processed therein.

Afterward, the processed signal is output from the first portion of the second bonding pads 391 of the control chip 39, and then transmitted to the first portion of the third electrical contacts 351 through the second wires 40. Next, the signal is further transmitted to the I/O pads 321 through the third circuit, so as to be output externally.

Figure 6:
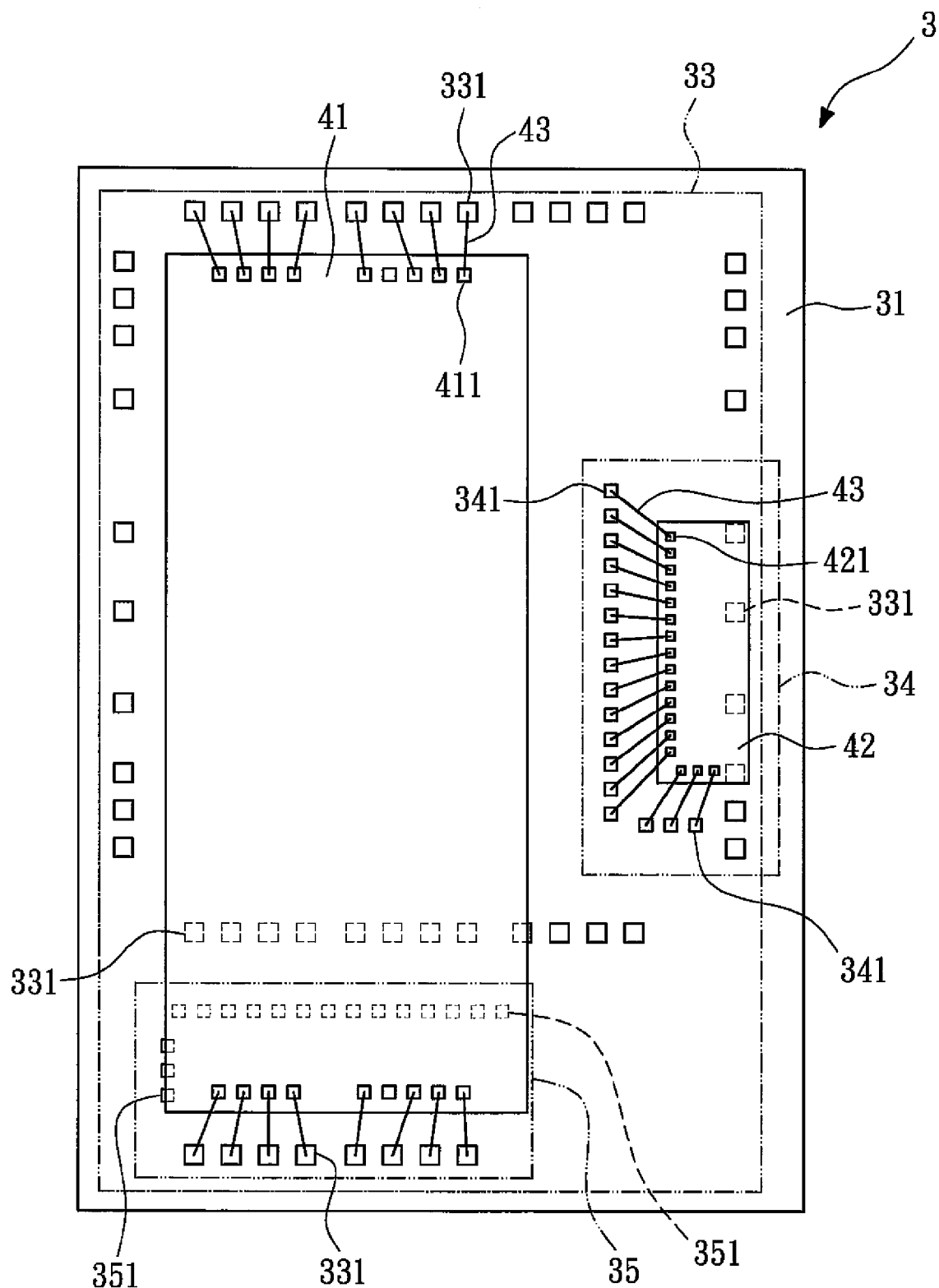
FIG. 6 is a schematic view of a circuit substrate according to a second implementation aspect of the present invention.

FIG. 6 shows a schematic view of a circuit substrate according to a second implementation aspect of the present invention. In this implementation aspect, a memory chip 41 is adhered to the first layout area 33, and the first electrical contacts 331 surround the memory chip 41. It is understood that the memory chip 41 can also be attached to the first layout area 33 through flip-chip. The memory chip 41 has a plurality of first bonding pads 411, and the first bonding pads 411 are electrically connected to the first electrical contacts 331 through a plurality of first wires 43. As can be seen in the figure, the memory chip 41 covers a portion of the third layout area 35.

Moreover, a control chip 42 is adhered to the second layout area 34, and has a plurality of second bonding pads 421. The second bonding pads 421 are electrically connected to the second electrical contacts 341 through a plurality of third wires 44.

Preferably, a molding compound (not shown) is used to encapsulate the upper surface 31 of the circuit substrate 3, i.e., to encapsulate the memory chip 41, the control chip 42, the first wires 43, and the third wires 44, so as to form a semiconductor package.

As shown in FIGS. 5 and 6, the first layout area 33, the second layout area 34 and the third layout area 35 of the circuit substrate 3 can carry only two chips (the memory chip 37 and the control chip 39 in FIG. 5, or the memory chip 41 and the control chip 42 in FIG. 6) at the same time. The two chips are located on the upper surface 31 of the circuit substrate 3. A comparison of FIG. 5 and FIG. 6 shows that, though the size of the memory chip 37 differs from that of the memory chip 41, the circuit substrate 3 can be in both cases. Thus, there is no need to make different substrate layout designs according to the size of the chip. Therefore, the design and manufacturing cost of the circuit substrate can be reduced.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A circuit substrate, comprising:
   an upper surface;
   a first layout area, located on the upper surface and having a plurality of first electrical contacts;
   a second layout area, located on the upper surface and having a plurality of second electrical contacts; and
   a third layout area, located on the upper surface and having a plurality of third electrical contacts, wherein the third electrical contacts and the second electrical contacts that have the same electrical property are electrically connected to each other, some portion of the second layout area overlaps the first layout area or the second layout area is located in the first layout area, some portion of the third layout area overlaps the first layout area or the third layout area is located in the first layout area, the first layout area, the second layout area and the third layout area are used to carry only two chips at the same time.

2. The circuit substrate as claimed in claim 1, wherein the second layout area and the third layout area have a mirror-image corresponding relation.

3. The circuit substrate as claimed in claim 1, wherein the first layout area carries a memory chip, the memory chip is adhered to the first layout area, the memory chip has a plurality of first bonding pads, and the first bonding pads are electrically connected to the first electrical contacts through a plurality of first wires.

4. The circuit substrate as claimed in claim 1, wherein the first layout area carries a memory chip, and the memory chip is attached to the first layout area through flip-chip bonding.

5. The circuit substrate as claimed in claim 1, wherein the first layout area carries a memory chip, the second layout area carries a control chip and the memory chip covers a portion of the third layout area.

6. The circuit substrate as claimed in claim 1, wherein the first layout area carries a memory chip, the second layout area carries a control chip, the control chip is adhered to the second layout area, the control chip has a plurality of second bonding pads, and the second bonding pads are electrically connected to the second electrical contacts through a plurality of second wires.

7. The circuit substrate as claimed in claim 1, wherein the first layout area carries a memory chip, the second layout area carries a control chip, and the control chip is attached to the second layout area through flip-chip.

8. The circuit substrate as claimed in claim 1, wherein the first layout area carries a memory chip, the third layout area carries a control chip, and the memory chip covers a portion of the second layout area.

9. The circuit substrate as claimed in claim 1, wherein the first layout area carries a memory chip, the third layout area carries a control chip, the control chip is adhered to the third layout area, the control chip has a plurality of second bonding pads, and the second bonding pads are electrically connected to the third electrical contacts through a plurality of third wires.

10. The circuit substrate as claimed in claim 1, wherein the first layout area carries a memory chip, the third layout area carries a control chip, and the control chip is attached to the third layout area through flip-chip bonding.

11. A semiconductor package, comprising:
    a circuit substrate, comprising:
    an upper surface;
    a first layout area, located on the upper surface and having a plurality of first electrical contacts;
    a second layout area, located on the upper surface and having a plurality of second electrical contacts; and
    a third layout area, located on the upper surface and having a plurality of third electrical contacts, wherein the third electrical contacts and the second electrical contacts that have the same electrical property are electrically connected to each other, some portion of the second layout area overlaps the first layout area or the second layout area is located in the first layout area, some portion of the third layout area overlaps the first layout area or the third layout is located in the first layout area;
    a memory chip, located in the first layout area and covering a portion of the second layout area or a portion of the third layout area; and
    a control chip, located in the second layout area or the third layout area which is not covered by the memory chip.

12. The semiconductor package as claimed in claim 11, wherein the second layout area and the third layout area have a mirror-image corresponding relation.

13. The semiconductor package as claimed in claim 11, wherein the memory chip is adhered to the first layout area, the memory chip has a plurality of first bonding pads, and the first bonding pads are electrically connected to the first electrical contacts through a plurality of first wires.

14. The semiconductor package as claimed in claim 11, wherein the memory chip is attached to the first layout area through flip-chip bonding.

15. The semiconductor package as claimed in claim 11, wherein the control chip is located in the second layout area, and the memory chip covers a portion of the third layout area.

16. The semiconductor package as claimed in claim 11, wherein the control chip is adhered to the second layout area, the control chip has a plurality of second bonding pads, and the second bonding pads are electrically connected to the second electrical contacts through a plurality of second wires.

17. The semiconductor package as claimed in claim 11, wherein the control chip is attached to the second layout area through flip-chip.

18. The semiconductor package as claimed in claim 11, wherein the control chip is located in the third layout area, and the memory chip covers a portion of the second layout area.

19. The semiconductor package as claimed in claim 11, wherein the control chip is adhered to the third layout area, the control chip has a plurality of second bonding pads, and the second bonding pads are electrically connected to the third electrical contacts through a plurality of third wires.

20. The semiconductor package as claimed in claim 11, wherein the control chip is attached to the third layout area through flip-chip bonding.

* * * * *